(12) United States Patent
Wang et al.

(10) Patent No.: US 10,283,024 B2
(45) Date of Patent: May 7, 2019

(54) DISPLAY DEVICE AND METHOD FOR DRIVING DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Haisheng Wang, Beijing (CN); Xue Dong, Beijing (CN); Hailin Xue, Beijing (CN); Xiaochuan Chen, Beijing (CN); Xiaoliang Ding, Beijing (CN); Yingming Liu, Beijing (CN); Hongjuan Liu, Beijing (CN); Weijie Zhao, Beijing (CN); Shengji Yang, Beijing (CN); Pengpeng Wang, Beijing (CN); Changfeng Li, Beijing (CN); Wei Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 201 days.

(21) Appl. No.: 15/357,945

(22) Filed: Nov. 21, 2016

(65) Prior Publication Data
US 2017/0249880 A1 Aug. 31, 2017

(30) Foreign Application Priority Data
Feb. 26, 2016 (CN) .......................... 2016 1 0108739

(51) Int. Cl.
*G09G 3/00* (2006.01)
*G09G 3/3208* (2016.01)
(Continued)

(52) U.S. Cl.
CPC ............. *G09G 3/003* (2013.01); *G02B 27/22* (2013.01); *G06F 3/044* (2013.01); *G06F 3/047* (2013.01);
(Continued)

(58) Field of Classification Search
CPC .... G09G 3/003; G09G 3/2003; G09G 3/3413; G09G 3/3208; G09G 3/3607;
(Continued)

(56) References Cited

U.S. PATENT DOCUMENTS

2006/0001968 A1  1/2006  Kim et al.
2008/0266387 A1*  10/2008  Krijn ................... H04N 13/305
                                                                348/51
(Continued)

FOREIGN PATENT DOCUMENTS

CN          1758091 A      4/2006
CN        103220538 A      7/2013
(Continued)

OTHER PUBLICATIONS

Office Action in Chinese Application No. 201610108739.3 dated Aug. 8, 2017, with English translation.

*Primary Examiner* — Afroza Chowdhury
(74) *Attorney, Agent, or Firm* — Womble Bond Dickinson (US) LLP

(57) ABSTRACT

A display device and a method for driving the display device are disclosed. The display device comprises a black and white liquid crystal display panel, an organic light emitting display panel, and a control unit. The control unit is configured to control the organic light emitting display panel to emit light, at least divide a frame of display time into a first time period, a second time period, and a third time period, and to drive the first primary color sub-pixel to emit light only in the first time period, the second primary color
(Continued)

sub-pixel to emit light only in the second time period, and the third primary color sub-pixel to emit light only in the third time period. According to embodiments of the present invention, there is no need to provide lenticular lenses or a slit grating to realize 3D display, thus reducing production cost.

9 Claims, 4 Drawing Sheets

(51) Int. Cl.
| | | |
|---|---|---|
| *G06F 3/041* | (2006.01) | |
| *G09G 3/36* | (2006.01) | |
| *G06F 3/044* | (2006.01) | |
| *G06F 3/047* | (2006.01) | |
| *G09G 3/34* | (2006.01) | |
| *G09G 3/20* | (2006.01) | |
| *G02B 27/22* | (2018.01) | |
| *H04N 13/04* | (2006.01) | |
| *G02F 1/1333* | (2006.01) | |
| *G02F 1/1335* | (2006.01) | |
| *G02F 1/1343* | (2006.01) | |
| *H01L 27/32* | (2006.01) | |
| *H01L 51/00* | (2006.01) | |

(52) U.S. Cl.
 CPC ......... *G06F 3/0412* (2013.01); *G09G 3/2003* (2013.01); *G09G 3/3413* (2013.01); *H04N 13/0418* (2013.01); *H04N 13/0422* (2013.01); *G02F 1/13338* (2013.01); *G02F 1/133305* (2013.01); *G02F 1/133528* (2013.01); *G02F 1/134336* (2013.01); *G02F 2001/133622* (2013.01); *G02F 2001/134345* (2013.01); *G02F 2201/121* (2013.01); *G02F 2201/44* (2013.01); *G06F 2203/04102* (2013.01); *G06F 2203/04103* (2013.01); *G09G 3/3208* (2013.01); *G09G 3/3607* (2013.01); *G09G 2300/023* (2013.01); *G09G 2300/0452* (2013.01); *G09G 2310/0235* (2013.01); *G09G 2310/08* (2013.01); *G09G 2380/02* (2013.01); *H01L 27/323* (2013.01); *H01L 27/3244* (2013.01); *H01L 51/0097* (2013.01)

(58) Field of Classification Search
 CPC ..... G09G 2300/023; G09G 2300/0452; G09G 2310/0235; G09G 2310/08; G09G 2380/02; G02B 27/22; G06F 3/0412; G06F 3/044; G06F 3/047; G06F 2203/04102; G06F 2203/04103; H04N 13/0418; H04N 13/0422; G02F 1/133305; G02F 1/13338; G02F 1/133528; G02F 1/134336; G02F 2001/133622; G02F 2001/134345; G02F 2201/121; G02F 2201/44; H01L 27/323; H01L 27/3244; H01L 51/0097
 See application file for complete search history.

(56) References Cited

U.S. PATENT DOCUMENTS

| | | | |
|---|---|---|---|
| 2013/0155059 A1* | 6/2013 | Wang | G06F 3/041 345/419 |
| 2013/0335463 A1* | 12/2013 | Chiang | G09G 3/003 345/697 |

FOREIGN PATENT DOCUMENTS

| | | |
|---|---|---|
| CN | 105093546 A | 11/2015 |
| JP | 2002062519 A | 2/2002 |
| JP | 2010191188 A | 9/2010 |

* cited by examiner

DISPLAY DEVICE AND METHOD FOR DRIVING DISPLAY DEVICE

RELATED APPLICATIONS

The present application claims the benefit of Chinese Patent Application No. 201610108739.3, filed Feb. 26, 2016, the entire disclosure of which is incorporated herein by reference.

TECHNICAL FIELD

The present invention relates to the field of display technology, and particularly to a display device and a method for driving the display device.

BACKGROUND

A thin film transistor liquid crystal display (TFT-LCD) is a mainstream product in the current display field, and has occupied the vast majority of market shares. With development in technology, the LCD has been appended with more display functions, e.g., a three-dimensional (3D) display which has been applied widely and is more realistic.

Currently, 3D display technology primarily comprises a glass type and a naked-eye type without glasses. The 3D display technology of the glass type has become very mature, but cannot free a viewer from being bundled by special purpose glasses, which impairs the range of application and comfort. Since the 3D display technology of the naked-eye tape does not need glasses, it has become more popular and become a development trend of the 3D display technology.

In the current naked-eye 3D display device based on a principle of parallax, lenticular lenses or a slit grating are generally adopted. Images of different viewing angles are displayed on different positions of the display, and are refracted or shielded, so that an image of a single viewing angle can only be viewed by a viewer through each glass at different viewing angles. Images with parallax viewed by both eyes enter human eyes and are synthesized in brain to present a 3D image. This method is easy to realize and does not need glasses.

In a word, during realizing the naked-eye 3D display, it is required to provide lenticular lenses or a slit grating, so that the production cost is high. Besides, in case lenticular lenses are used for imaging at large viewing angles, the aberration of lenticular lenses will seriously impact the quality of 3D imaging.

SUMMARY

Embodiments of the present invention provide a display device and a method for driving the display device, to alleviate or eliminate one or more of the foregoing problems.

Embodiments of the present invention provide a display device, comprising a black and white liquid crystal display panel; an organic light emitting display panel, bonded to the black and white liquid crystal display panel; and a control unit, configured to control the organic light emitting display panel to emit light, wherein the organic light emitting display panel comprises a plurality of pixels arranged in an array, and each of the pixels comprises a first primary color sub-pixel, a second primary color sub-pixel, and a third primary color sub-pixel, wherein the black and white liquid crystal display panel comprises a plurality of pixel units arranged in an array, and each of the pixels corresponds to at least one of the pixel units, and wherein the control unit is configured to at least divide a frame of display time into a first time period, a second time period, and a third time period, and to drive the first primary color sub-pixel to emit light only in the first time period, the second primary color sub-pixel to emit light only in the second time period, and the third primary color sub-pixel to emit light only in the third time period.

For example, the first time period, the second time period, and the third time period have a same duration.

For example, the display device further comprises a flexible printed circuit which is configured to control a pixel circuit in the organic light emitting display panel to operate, wherein the control unit is bonded to a back-plate of the organic light emitting display panel through the flexible printed circuit.

For example, the black and white liquid crystal display panel further comprises a lower polarizer, the organic light emitting display panel further comprises a packaging cover, and the black and white liquid crystal display panel and the organic light emitting display panel are bonded with each other through the lower polarizer and packaging cover.

For example, the back-plate is a glass baseplate or a flexible baseplate.

For example, the packaging cover is a glass baseplate.

For example, the display device further comprises a touch unit, wherein the black and white liquid crystal display panel comprises an array substrate, the array substrate is provided with a plurality of independent self-capacitance electrodes, each of the self-capacitance electrodes are connected with the touch unit through a touch wiring, and the self-capacitance electrodes multiplex common electrodes in the array substrate comprise.

For example, the common electrodes are made from indium tin oxide, indium zinc oxide, or a composite material of indium tin oxide and indium zinc oxide.

For example, the first primary color sub-pixel is a red sub-pixel, the second primary color sub-pixel is a green sub-pixel, and the third primary color sub-pixel is a blue sub-pixel.

Embodiments of the present invention further provide a method for driving the foregoing display device, comprising:

driving the first primary color sub-pixel to emit light only in the first time period, the second primary color sub-pixel to emit light only in the second time period, the third primary color sub-pixel to emit light only in the third time period, by using the control unit to display in a 3D mode; and driving the first time period, the second time period, and the third primary color sub-pixel to emit light in the first time period, the second time period, and the third time period, by using the control unit to display in a 2D mode.

For example, the first time period, the second time period, and the third time period have a same duration.

For example, the first primary color sub-pixel is a red sub-pixel, the second primary color sub-pixel is a green sub-pixel, and the third primary color sub-pixel is a blue sub-pixel.

DETAILED DESCRIPTION OF EMBODIMENTS

Figure 1:
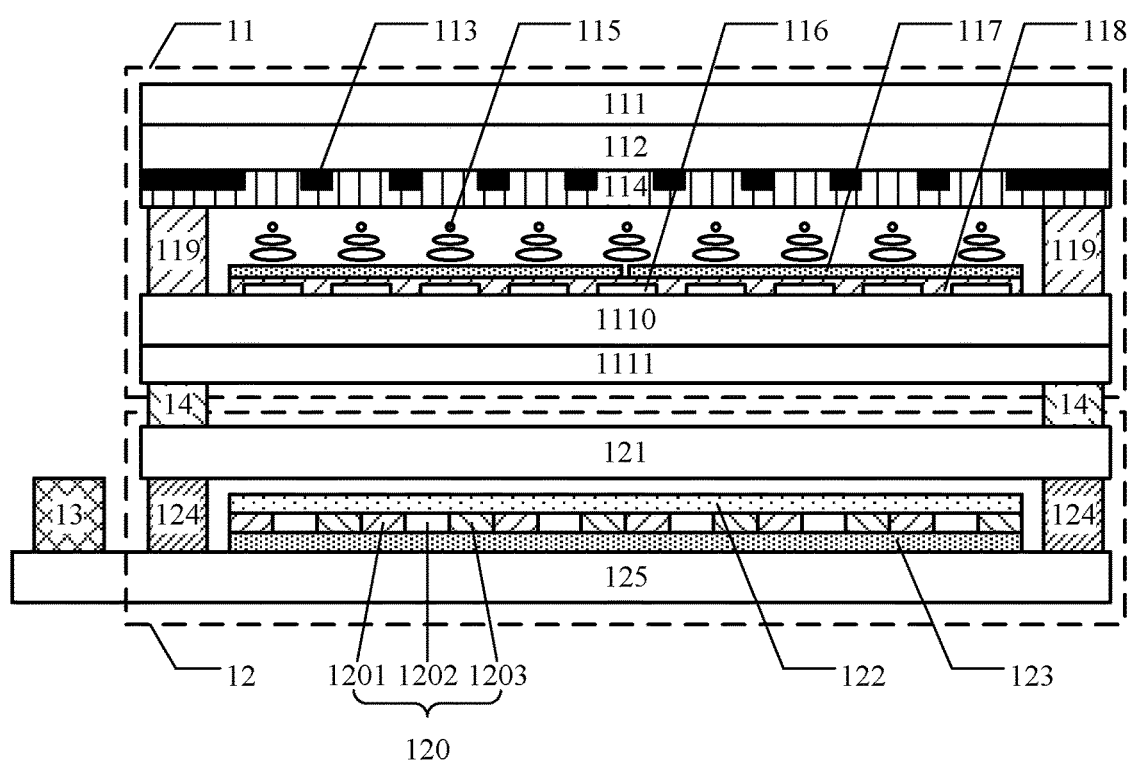
FIG. 1 is a structural view for illustrating a display device in an embodiment of the present invention.

Embodiments of the present invention provide a display device and a method for driving the display device, for example, for realizing 3D display without lenticular lenses or a slit grating, thus reducing production cost.

Unless otherwise defined, the technical or scientific terms used in the present invention shall have the general meanings understandable for those ordinarily skilled in the field of the present invention. The wordings such as "first", "second" or similar used in the description and claims of the present invention shall not represent any order, number or importance, but are used for distinguishing different elements. Similarly, the words such as "an", "a" or similar shall not represent limitation of numbers, but mean existence of at least one. The words "comprise", "include" or similar indicate an element or article preceding these words shall contain elements or articles listed behind these words and equivalents thereto, and do not exclude the presence of elements or articles other than those listed. The phrases "upper", "lower", "left", "right" and etc. shall be used only to represent relative positions, wherein, when the absolute position of the described object is changed, the relative positions may be changed accordingly.

To make the objects, the technical solutions and the advantages of embodiments of the present invention more apparent, the technical solutions of the embodiments of the present invention will be described in detail hereinafter in conjunction with the drawings of the embodiments of the present invention. Apparently, the embodiments described hereinafter are only some embodiments of the present invention, but not all embodiments. Based the embodiments described hereinafter, other embodiments obtained by those skilled in the art should fall within the scope of the present invention.

A display device in embodiments of the present invention will be described hereinafter by referring to the drawings.

The thickness, size, and shape of layers in the drawings are not drawn to scale, but only for illustrating the content of the present invention.

Reference numerals: 11 black and white liquid crystal display panel; 111 upper polarizer; 112 second substrate; 113 black matrix; 114 protection layer; 115 liquid crystal layer; 116 pixel electrode; 117 common electrode; 118 insulating layer; 119 sealing agent; 14 bonding glue; 124 packaging glue; 12 organic light emitting display panel; 13 control unit; 1110 first substrate; 1111 lower polarizer; 120, 23 pixel; 1201, 1202, 1203 sub-pixel; 121 packaging cover; 122 cathode; 123 organic light emitting circuit array; 125 backplate; 21 left eye; 22 right eye; 24, P1, P2, P3, P4, P5, P6, P7, P8, P9, P10, P11, P12, P13 pixel unit.

As shown in FIG. 1, an exemplary embodiment provides a display device, which comprises a black and white liquid crystal display panel 11, an organic light emitting display panel 12 bonded to the black and white liquid crystal display panel 11, and a control unit 13 which controls the organic light emitting display panel to emit light.

In embodiments of the present invention, the black and white liquid crystal display panel refers to a liquid crystal display panel in which no color resist is arranged. On one hand, since the black and white liquid crystal display panel is not provided with any color resist, the display device has an increased light transmissivity. On the other hand, the directionality problem for a 3D display device to realize 3D display due to the presence of color resists no longer exists, i.e., 3D display can still be realized even when the display device is rotated by 90 degrees.

The organic light emitting display panel 12 acts as a backlight for the black and white liquid crystal display panel 11, and comprises a plurality of pixels 120 arranged in an array. Each of the pixels 120 comprises a red (R) sub-pixel 1201, a green (G) sub-pixel 1202, and a blue (B) sub-pixel 1203.

The black and white liquid crystal display panel 11 comprises a plurality of pixel units arranged in an array (not shown). Each of the pixels 120 corresponds to at least one of the pixel units. Pixel units in the black and white liquid crystal display panel 11 are arranged in a same manner as the existing art, which is not repeated for simplicity.

The control unit 13 is configured to at least divide a frame of display time into a first time period, a second time period, and a third time period, and to drive the red sub-pixel 1201 to emit light only in the first time period, the green sub-pixel 1202 to emit light only in the second time period, and the blue sub-pixel 1203 to emit light only in the third time period.

In an exemplary embodiment, the black and white liquid crystal display panel 11 comprises an array substrate and a counter substrate which are arranged oppositely, a liquid crystal layer 115 between the array substrate and the counter substrate, a lower polarizer 1111 on a side of the array substrate away from the counter substrate, an upper polarizer 111 on a side of the counter substrate away from the array substrate, and a sealing agent 119 which bonds the array substrate to the counter substrate.

In an exemplary embodiment, the array substrate comprises a first substrate 1110, pixel electrodes 116 and common electrodes 117 on the first substrate 1110, and an insulating layer 118 between the pixel electrodes 116 and common electrodes 117. The first substrate 1110 for example is a glass baseplate. In other embodiments, the first substrate 1110 is a baseplate like a flexible baseplate. Other layers in the array substrate comprise, e.g., a gate layer, a source/drain layer or the like, are not shown. These layers on the array substrate are arranged in a same manner as the existing art, which is not repeated for simplicity.

In an exemplary embodiment, the counter substrate comprises a second substrate 112, a black matrix 113 on the second substrate 112, and a protection layer 114 on the black matrix 113. The second substrate 112 for example is a glass baseplate. In other embodiments, the second substrate 112 is a baseplate like a flexible baseplate. These layers on the counter substrate are arranged in a similar manner as the existing art which is not repeated for simplicity, and the difference lies in that no color film is arranged on the counter substrate.

In an exemplary embodiment, the organic light emitting display panel 12 comprises a back-plate 125, an organic light emitting circuit array 123 on the back-plate 125, a cathode 122 over the organic light emitting circuit array 123, a packaging cover 121 which is arranged opposite to the back-plate, and a packaging glue 124 which bonds the back-plate 125 with the packaging cover 121. The back-plate 125 of the organic light emitting display panel 12 for example is a glass baseplate or a flexible baseplate, and the packaging cover 121 is a glass baseplate. Of course, in practical application, the back-plate and the packaging cover can be baseplate of other types. Materials of the back-plate and the packaging cover are not limited herein. Various layers and the organic light emitting circuit array on the organic light emitting display panel 12 are arranged in a similar manner as the existing art, which is not repeated for simplicity.

In an exemplary embodiment, as shown in FIG. 1, the lower polarizer 1111 of the black and white liquid crystal display panel 11 is bonded to the packaging cover 121 of the organic light emitting display panel 12 through bonding glue 14. In this case, the organic light emitting display panel 12 acts as a backlight of the black and white liquid crystal display panel 11.

In an exemplary embodiment, the display device further comprises a flexible printed circuit (FPC, not shown), which is configured to control a pixel circuit in the organic light emitting display panel 12 to operate. As shown in FIG. 1, in this embodiment, the control unit 13 is bonded onto the back-plate 125 of the organic light emitting display panel 12 through the FPC, and is configured to control the organic light emitting display panel 12 to emit light.

A process for realizing 3D display by a display device in an embodiment of the present invention will be described in detail hereinafter in conjunction with the drawings.

To realize 3D display, it is required for respective pixel unit in the black and white liquid crystal display panel 11 to display different views, e.g., a first view and a second view. Furthermore, it is required for a content of the first view to only enter a left eye of a viewer, and a content of the second view to only enter a right eye of the viewer.

Figure 2:
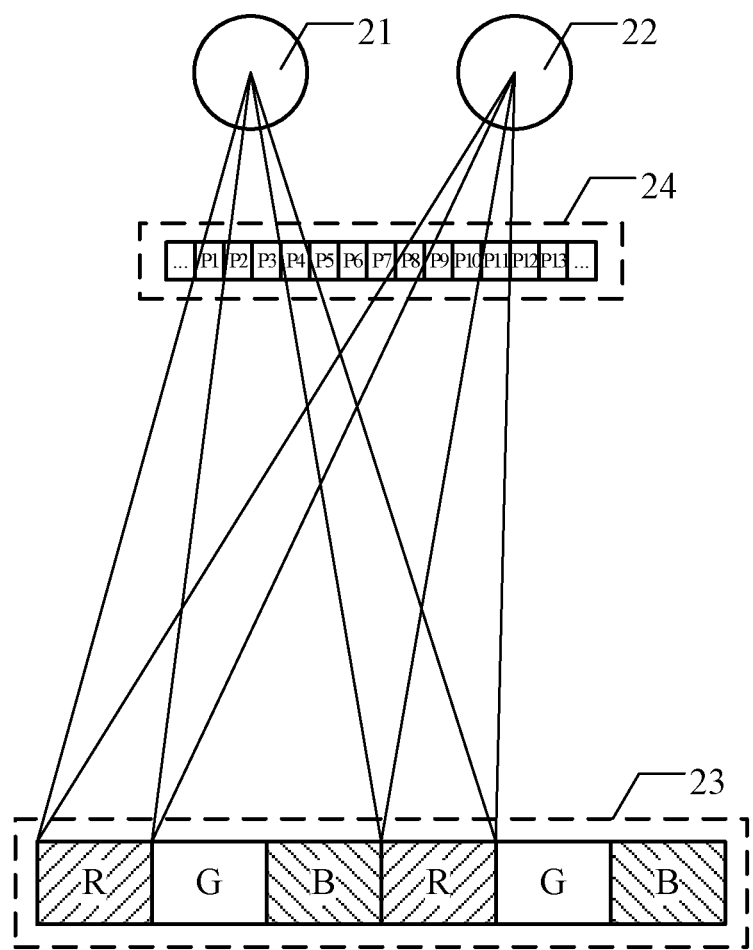
FIG. 2 is a view for illustrating light propagation in a first time period of a frame of display time for a display device in an embodiment of the present invention.

In particular, as shown in FIG. 2, a reference numeral 23 indicates a plurality of pixels in the organic light emitting display panel 12, and a reference numeral 24 indicates a plurality of pixel units in the black and white liquid crystal display panel 11. In in the first time period of a frame of display time for the organic light emitting display panel 12, all R sub-pixels emit light, and none of the G sub-pixels and B sub-pixels emits light, so that in this case the organic light emitting display panel 12 is equivalent to a red backlight. Here, description is made by taking a case in which the organic light emitting display panel 12 comprises 2 R sub-pixels, 2 G sub-pixels, and 2 B sub-pixels as an example. As shown in FIG. 2, light from a left R sub-pixel passes a pixel unit P1 of the black and white liquid crystal display panel 11 and enters the left eye 21, and passes a pixel unit P8 of the black and white liquid crystal display panel 11 and enters the right eye 22. Light from a right R sub-pixel passes a pixel unit P4 of the black and white liquid crystal display panel 11 and enters the left eye 21, and passes a pixel unit P11 of the black and white liquid crystal display panel 11 and enters the right eye 22.

Figure 3:
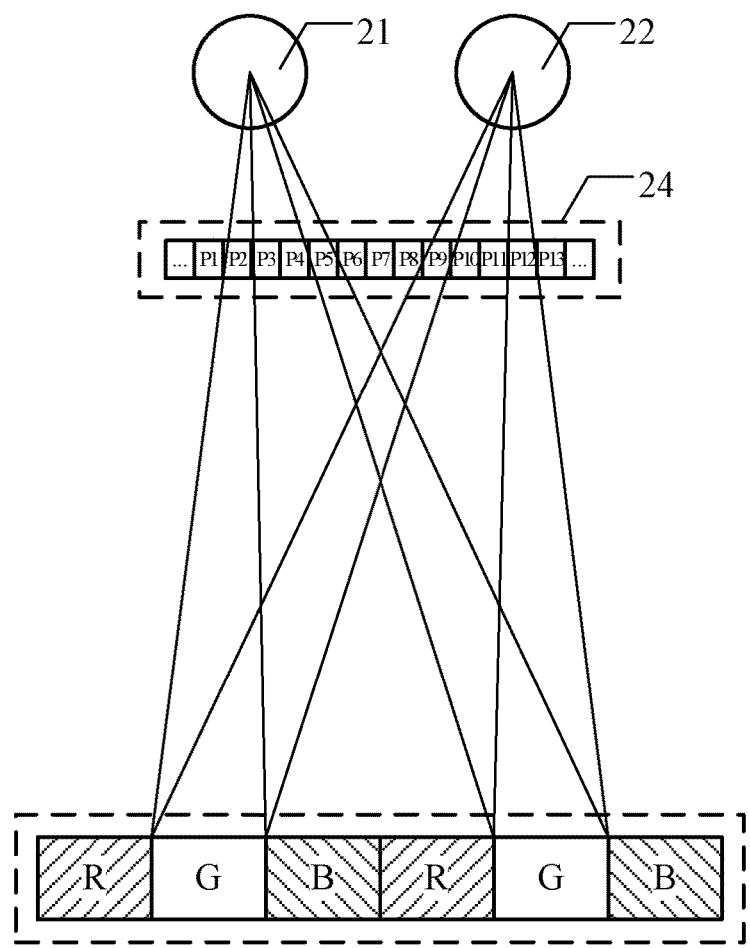
FIG. 3 is a view for illustrating light propagation in a second time period of a frame of display time for a display device in an embodiment of the present invention.

As shown in FIG. 3, in the second time period of a frame of display time of the organic light emitting display panel 12, all G sub-pixels emit light, and none of R sub-pixels and B sub-pixels emits light, so that in this case the organic light emitting display panel 12 is equivalent to a green backlight. As shown in FIG. 3, light from a left G sub-pixel passes a pixel unit P2 of the black and white liquid crystal display panel 11 and enters the left eye 21, and passes a pixel unit P9 of the black and white liquid crystal display panel 11 and enters the right eye 22. Light from a right G sub-pixel passes a pixel unit P5 of the black and white liquid crystal display panel 11 and enters the left eye 21, and passes a pixel unit P12 of the black and white liquid crystal display panel 11 and enters the right eye 22.

Figure 4:
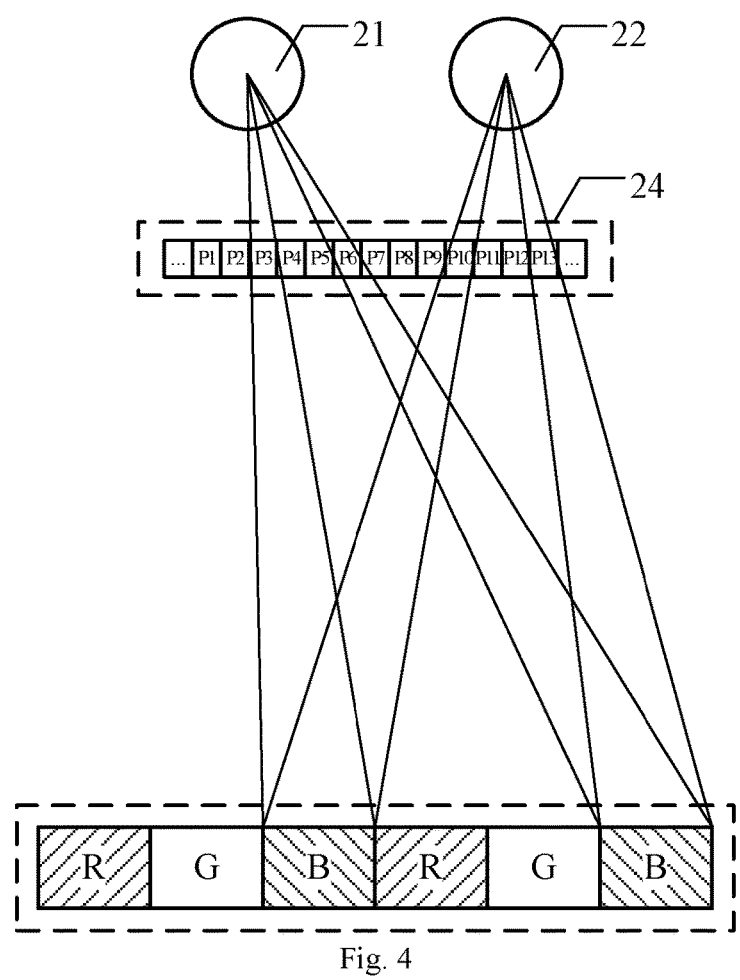
FIG. 4 is a view for illustrating light propagation in a third time period of a frame of display time for a display device in an embodiment of the present invention.

As shown in FIG. 4, in the third time period of a frame of display time of the organic light emitting display panel 12, all B sub-pixels emit light, and none of R sub-pixels and G sub-pixels emits light, so that in this case the organic light emitting display panel 12 is equivalent to a blue backlight. As shown in FIG. 4, light from a left B sub-pixel passes a pixel unit P3 of the black and white liquid crystal display panel 11 and enters the left eye 21, and passes a pixel unit P10 of the black and white liquid crystal display panel 11 and enters the right eye 22. Light from a right B sub-pixel passes a pixel unit P6 of the black and white liquid crystal display panel 11 and enters the left eye 21, and passes a pixel unit P13 of the black and white liquid crystal display panel 11 and enters the right eye 22.

Of course, in an exemplary embodiment, only B sub-pixels are drive to emit light in the first time period, and in another exemplary embodiment, only G sub-pixels are drive to emit light in the first time period. A sequence for R sub-pixels, G sub-pixels, and B sub-pixels to emit light is not limited in embodiments of the present invention.

In an exemplary embodiment, the first time period, the second time period, and the third time period have a same duration, so that the quality of views observed by the viewer is ensured. In a specific embodiment of the present invention, when a certain sub-pixel in the organic light emitting display panel emits light, the other two sub-pixels get in a dark state. These two sub-pixels in the dark state are equivalent to a rear grating during 3D display. In this case, 3D display effect can be realized, by allocating pixel units in the black and white liquid crystal display panel to display gray scale contents of the first view and the second view, respectively. In this embodiment, it is not required for the organic light emitting display panel to have a same resolution as the black and white liquid crystal display panel. It is possible for the organic light emitting display panel to have a resolution lower than that of the black and white liquid crystal display panel. In the case of FIGS. 2, 3, and 4, the pixel units P1, P2, P3 and the pixel units P4, P5, P6 represent the gray scale of the first view displayed by two R, G, B sub-pixels respectively, and the pixel units P8, P9, P10 and the pixel units P11, P12, P13 represent the gray scale of the second view displayed by two R, G, B sub-pixels, respectively.

In a specific embodiment, as shown in FIGS. 2, 3, and 4, the pixel unit P7 in the black and white liquid crystal display panel 11 does not receive light emitted from the organic light emitting display panel 12. When human eyes 21, 22 offset with respect to the black and white liquid crystal display panel 11, light emitted from sub-pixels of the organic light emitting display panel 12 when energized can pass the pixel unit P7 and enter the left eye 21 to display the content of the first view, and can pass the pixel unit P7 and enter the right eye 22 to display the content of the second view. Whether light enters the left eye or the right eye can be adjusted on basis of the position of human eyes and the position of pixels to be displayed.

Furthermore, in an exemplary embodiment, the black and white liquid crystal display panel 11 is a panel with a touch function. The black and white liquid crystal display panel 11 for example further comprises a touch unit. The array substrate of the black and white liquid crystal display panel 11 is provided with a plurality of independent self-capacitance electrodes, each of the self-capacitance electrodes is connected with the touch unit through a touch wiring, and the self-capacitance electrodes multiplex common electrodes of the array substrate. The self-capacitance electrodes, the touch wirings, and the touch unit are arranged in a same manner as the existing art, which is not repeated for simplicity. Of course, in this embodiment, driving electrodes and sensing electrodes for producing mutual capacitance can be arranged in the black and white liquid crystal display panel 11. The drive electrodes and the sensing electrodes are arranged in a same manner as the existing art.

For example, in an exemplary embodiment, the common electrodes 117 are made from indium tin oxide (ITO), indium zinc oxide (IZO), or a composite material of ITO and IZO. In other embodiments, the common electrodes 117 are made from other materials. The material from which the common electrodes are made is not limited herein.

Embodiments of the present invention further provide a method for driving the above display device, comprising:

driving the first primary color sub-pixel to emit light only in the first time period, the second primary color sub-pixel to emit light only in the second time period, and the third primary color sub-pixel to emit light only in the third time period, by using the control unit to display in a 3D mode; and driving the first time period, the second time period, and the third primary color sub-pixel to emit light in the first time period, the second time period, and the third time period, by using the control unit to display in a 2D mode.

For example, in an exemplary embodiment, the first time period, the second time period, and the third time period have a same duration.

For example, in an exemplary embodiment, the first primary color sub-pixel is a red sub-pixel, the second primary color sub-pixel is a green sub-pixel, and the third primary color sub-pixel is a blue sub-pixel.

In summary, embodiments of the present invention provide a display device, comprising a black and white liquid crystal display panel; an organic light emitting display panel bonded to the black and white liquid crystal display panel; and a control unit configured to control organic light emitting display panel to emit light. The organic light emitting display panel acts as a backlight for the black and white liquid crystal display panel. The organic light emitting display panel comprises a plurality of pixels arranged in an array, and each of the pixels comprises a first primary color sub-pixel, a second primary color sub-pixel, and a third primary color sub-pixel. The black and white liquid crystal display panel comprises a plurality of pixel units arranged in an array, and each of the pixels corresponds to at least one of the pixel units. The control unit is configured to at least divide a frame of display time into a first time period, a second time period, and a third time period, and to drive the first primary color sub-pixel to emit light only in the first time period, the second primary color sub-pixel to emit light only in the second time period, and the third primary color sub-pixel to emit light only in the third time period. In embodiments of the present invention, when a certain sub-pixel emits light within a frame of display time, none of the remaining two sub-pixels emits light, and these two sub-pixels which do not emit light are equivalent to a rear grating during 3D display. As compared with the existing art, there is no need to provide lenticular lenses or a slit grating. In this case, 3D display effect can be realized, by allocating pixel units in the black and white liquid crystal display panel reasonably according to the optical path, so that different pixel units display a gray scale content for the left eye and the right eye respectively.

The above are merely embodiments of the present invention. It should be appreciated that, a person skilled in the art may make further improvements and modifications without departing from the principle of the present invention, and these improvements and modifications shall also fall within the scope of the present invention.

What is claimed is:

1. A display device, comprising:
a black and white liquid crystal display panel;
an organic light emitting display panel, bonded to the black and white liquid crystal display panel; and
a control unit, configured to control the organic light emitting display panel to emit light;
wherein the organic light emitting display panel comprises a plurality of pixels arranged in an array, and each of the pixels comprises a first primary color sub-pixel, a second primary color sub-pixel, and a third primary color sub-pixel;
wherein the black and white liquid crystal display panel comprises a plurality of pixel units arranged in an array, and each of the pixels corresponds to at least one of the pixel units;
wherein the control unit is configured to at least divide a frame of display time into a first time period, a second time period, and a third time period, and to drive the first primary color sub-pixel to emit light only in the first time period, the second primary color sub-pixel to emit light only in the second time period, and the third primary color sub-pixel to emit light only in the third time period; and
wherein the display device further comprises a flexible printed circuit which is configured to control a pixel circuit in the organic light emitting display panel to operate; the control unit is bonded to a back-plate of the organic light emitting display panel through the flexible printed circuit.

2. The display device of claim 1, wherein the first time period, the second time period, and the third time period have a same duration.

3. The display device of claim 1, wherein the black and white liquid crystal display panel further comprises a lower polarizer, the organic light emitting display panel further comprises a packaging cover, and the black and white liquid crystal display panel and the organic light emitting display panel are bonded with each other through the lower polarizer and packaging cover.

4. The display device of claim 3, wherein the back-plate is a glass baseplate or a flexible baseplate.

5. The display device of claim 4, wherein the packaging cover is a glass baseplate.

6. The display device of claim 1, wherein the first primary color sub-pixel is a red sub-pixel, the second primary color sub-pixel is a green sub-pixel, and the third primary color sub-pixel is a blue sub-pixel.

7. A method for driving a display device;
wherein the display device comprises: a black and white liquid crystal display panel;
an organic light emitting display panel, bonded to the black and white liquid crystal display panel; and a control unit, configured to control the organic light emitting display panel to emit light;
wherein the organic light emitting display panel comprises a plurality of pixels arranged in an array, and each of the pixels comprises a first primary color sub-pixel, a second primary color sub-pixel, and a third primary color sub-pixel;
wherein the black and white liquid crystal display panel comprises a plurality of pixel units arranged in an array, and each of the pixels corresponds to at least one of the pixel units;
wherein the control unit is configured to at least divide a frame of display time into a first time period, a second time period, and a third time period, and to drive the first primary color sub-pixel to emit light only in the first time period, the second primary color sub-pixel to emit light only in the second time period, and the third primary color sub-pixel to emit light only in the third time period; and wherein the display device further comprises a flexible printed circuit which is configured to control a pixel circuit in the organic light emitting display panel to operate; the control unit is bonded to a back-plate of the organic light emitting display panel through the flexible printed circuit;

wherein the method comprises:

driving the first primary color sub-pixel to emit light only in the first time period, the second primary color sub-pixel to emit light only in the second time period, and the third primary color sub-pixel to emit light only in the third time period; by using the control unit to display in a 3D mode; and driving the first, second and third prima color sub-pixel to emit light in the first, second and third time period by using the control unit, to display in a 2D mode.

8. The method of claim 7, wherein the first time period, the second time period, and the third time period have a same duration.

9. The method of claim 7, wherein the first primary color sub-pixel is a red sub-pixel, the second primary color sub-pixel is a green sub-pixel, and the third primary color sub-pixel is a blue sub-pixel.

* * * * *